United States Patent
Kaspi et al.

(10) Patent No.: US 10,404,034 B1
(45) Date of Patent: Sep. 3, 2019

(54) FUNDAMENTAL MODE OPERATION IN BROAD AREA QUANTUM CASCADE LASERS

(71) Applicant: The United States of America, as represented by the Secretary of the Air Force, Washington, DC (US)

(72) Inventors: Ron Kaspi, Albuquerque, NM (US); Chi Yang, Albuquerque, NM (US)

(73) Assignee: THE UNITED STATES OF AMERICA AS REPRESENTED BY THE SECRETARY OF THE AIR FORCE, Washington, DC (US)

( * ) Notice: Subject to any disclaimer, the term of this patent is extended or adjusted under 35 U.S.C. 154(b) by 0 days.

(21) Appl. No.: 16/137,149

(22) Filed: Sep. 20, 2018

Related U.S. Application Data

(63) Continuation of application No. 15/676,825, filed on Aug. 14, 2017, now Pat. No. 10,084,282.

(51) Int. Cl.
*H01S 5/065* (2006.01)
*H01S 5/34* (2006.01)

(52) U.S. Cl.
CPC .......... *H01S 5/0655* (2013.01); *H01S 5/3402* (2013.01); *H01S 2301/166* (2013.01)

(58) Field of Classification Search
CPC ... H01S 5/3402; H01S 2301/166; H01S 5/065
USPC ............. 372/46.01, 20, 44.01; 385/129
See application file for complete search history.

(56) References Cited

U.S. PATENT DOCUMENTS

| | | | |
|---|---|---|---|
| 2003/0219053 A1* | 11/2003 | Swint ............ | H01S 5/10 372/46.01 |
| 2012/0195335 A1* | 8/2012 | Kalosha ......... | H01S 5/1003 372/45.01 |
| 2014/0355634 A1* | 12/2014 | Hashimoto ....... | H01S 5/227 372/45.01 |

* cited by examiner

*Primary Examiner* — Tuan N Nguyen
(74) *Attorney, Agent, or Firm* — James M. Skorich

(57) ABSTRACT

A broad area quantum cascade laser subject to having high order transverse optical modes during operation includes a laser cavity at least partially enclosed by walls, and a perturbation in the laser cavity extending from one or more of the walls. The perturbation may have a shape and a size sufficient to suppress high order transverse optical modes during operation of the broad area quantum cascade laser, where a fundamental transverse optical mode is selected over the high order transverse optical modes. As a result, the fundamental transverse mode operation in broad-area quantum cascade lasers may be regained, when it could not otherwise be without such a perturbation.

16 Claims, 9 Drawing Sheets

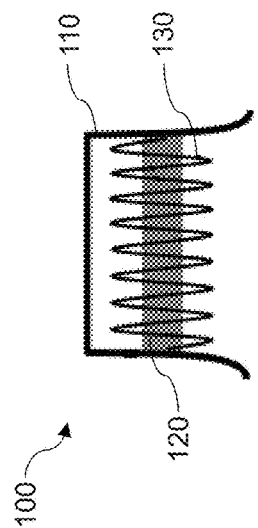
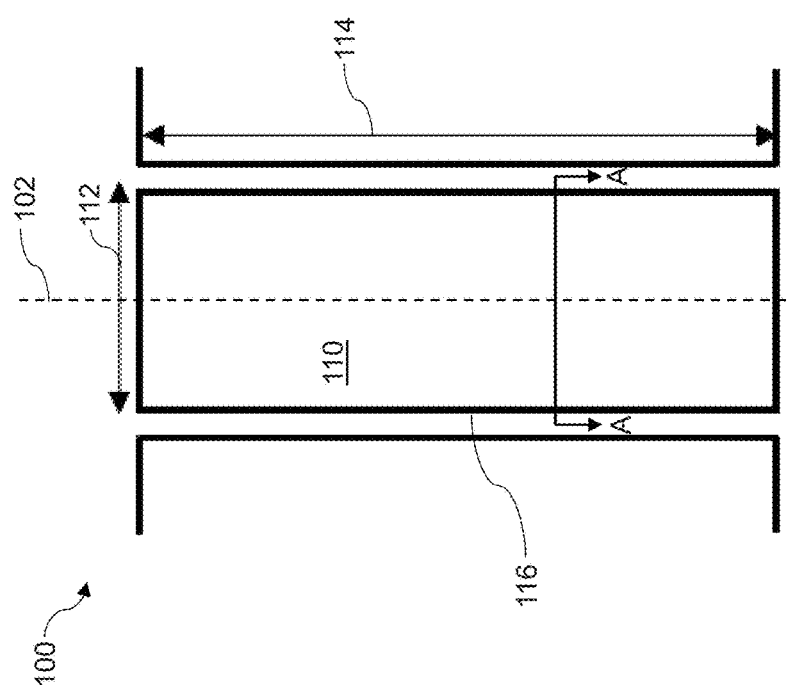
FIG. 1A (prior art)
FIG. 1B (prior art)

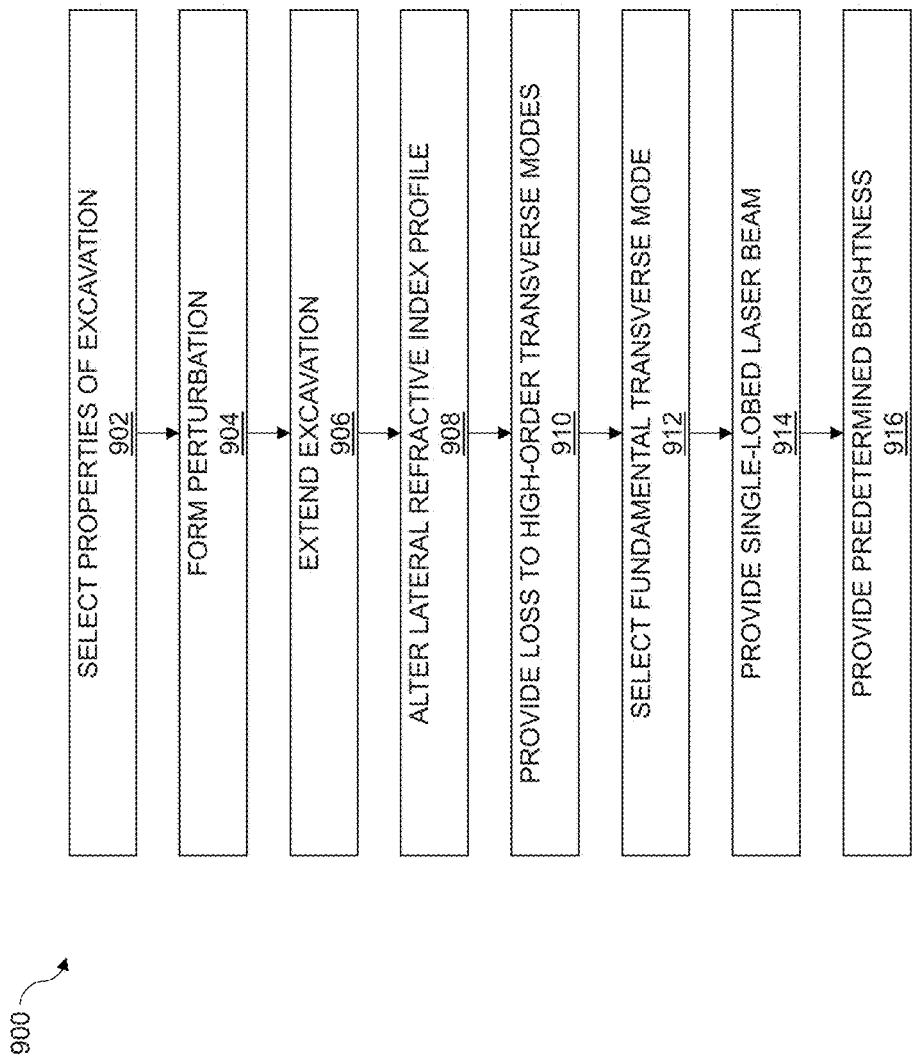

FUNDAMENTAL MODE OPERATION IN BROAD AREA QUANTUM CASCADE LASERS

CROSS-REFERENCE TO RELATED PATENT APPLICATIONS

The application is a continuation of U.S. patent application Ser. No. 15/676,825 filed on Aug. 14, 2017, the entire content of which is hereby incorporated by reference.

STATEMENT OF GOVERNMENT INTEREST

The invention described herein may be manufactured, used, and licensed by or for the Government of the United States for all governmental purposes without the payment of any royalty.

BACKGROUND

Quantum cascade lasers (QCLs) are unipolar semiconductor lasers that use optical transitions between electronic sub-bands to produce light. QCLs can be designed to emit in the mid-infrared wavelength range (e.g., 2 µm-20 µm), and more recently in the long-infrared wavelength range, e.g., the terahertz spectral range. QCL technology has generally reached a maturity level where it can provide relatively reliable operation for use in a large variety of applications. By way of example and not limitation, detectors that incorporate QCLs can be used for chemical sensing such as pollution monitoring, gas sensing, medical diagnostics (e.g., through breath analysis), the remote detection of toxic chemicals and explosives, and others. For applications requiring radiation at a single frequency, the longitudinal mode selection in QCLs may be provided, where single longitudinal mode operation of QCLs can be achieved by fabricating the QCLs as distributed feedback lasers (DFB-QCL).

In a typical DFB-QCL device, a grating has grooves etched at the top of the device that are aligned perpendicular to the optical axis of the device to produce index coupling, which selects the longitudinal mode for single frequency emission. Many embodiments of this basic idea exist to improve the selection of the single longitudinal mode in such DFB-QCL devices.

In contrast to the longitudinal mode, the transverse (or lateral) mode in QCLs is generally not selectively controlled in existing devices. Instead, a QCL device may have a sufficiently narrow width such that only the fundamental transverse mode is active. The fundamental transverse mode ensures that a single diffraction-limited beam along the optical axis of the laser is emitted, with an angular divergence determined by the wavelength of the light and the width of the device. The power level that can be generated in a QCL, as in other semiconductor lasers, may scale with the area of the device. In instances where additional power is desired, a larger area QCL device may be fabricated, where a QCL device with a cavity width larger than 12-15 micrometers is generally referred to as a broad area device (BA-QCL).

In practice, scaling of the power by enlarging the area of the QCL is typically limited to increasing the cavity length, rather than the cavity width of the QCL. This is because keeping a narrow cavity can maintain fundamental transverse mode operation, whereas increasing the cavity width may result in the operation of high-order transverse modes, as they become more favorable. For example, if an existing mid-infrared QCL is fabricated with a cavity width of about 15 micrometers, this may lead to the emergence of high-order transverse modes, resulting in mode competition, beam steering, and loss of brightness. In cavity widths of about 20 micrometers and higher, one or several high-order transverse modes may be active where each high-order transverse mode forms a periodic structure in the near-field of the QCL device, resulting in a laser beam with two distinct lobes, where each lobe deviates from the optical axis by an angle that becomes larger as the mode number increases—see, e.g., Y. Bai et al., APPLIED PHYSICS LETTERS 95, 221104 (2009), which is hereby incorporated by reference.

Several approaches have been attempted to produce single lobed emission—the result of a fundamental transverse mode—in BA-QCLs. These include the use of angled cavities, photonic crystal gratings, gain-guided devices, and the use of a porous structure above the active region of the device. However, there are some disadvantages associated with these techniques. For example, in angled cavity configuration, the facet angles and the cavity length must be precisely controlled for single lobed emission—see, e.g., D. Heydari et al., APPLIED PHYSICS LETTERS 106, 091105 (2015), which is hereby incorporated by reference. In gain-guided devices, the current spreading determines the effective width of the device, and this results in a strong variation of the beam divergence with injection current—see, e.g., I. Sergachev et al., OPTICS EXPRESS 24, 19063 (2016), which is hereby incorporated by reference. In another approach, lateral constrictions in the waveguide were placed using a focused ion beam milling technique where only the fundamental mode was allowed to propagate to produce a Gaussian shaped far-field pattern—see, e.g., Bouzi et al., APPL. PHYS. LETT. 102, 122105 (2013), which is hereby incorporated by reference. However, this approach was limited to devices with a narrow cavity width (w=10 µm), not BA-QCLs, and the trenches had to be filled with metal to provide additional losses to achieve the desired effect. Therefore, there remains a need for improved devices, systems, and methods for extracting and maintaining fundamental transverse mode operation in BA-QCLs.

SUMMARY

In an implementation, a broad area quantum cascade laser subject to having high order transverse optical modes during operation includes an optical cavity at least partially enclosed by walls, and a perturbation in the optical cavity extending from one or more of the walls. The perturbation may have a shape and a size sufficient to suppress high order transverse optical modes during operation of the broad area quantum cascade laser, where a fundamental transverse optical mode is selected over the high order transverse optical modes.

In another implementation, a method includes forming a perturbation in an optical cavity of a broad area quantum cascade laser, where the perturbation extends from one or more walls of the optical cavity. The method may also include suppressing, with the perturbation, high order transverse optical modes during operation of the broad area quantum cascade laser, where a fundamental transverse optical mode is selected over the high order transverse optical modes.

In yet another implementation, a broad area quantum cascade laser includes an optical cavity having an active region disposed between a top cladding and a bottom cladding. The broad area quantum cascade laser may also include at least two excavations formed in a top surface of the optical cavity, where the excavations extend into at least the top cladding of the optical cavity. The broad area quantum cascade laser may also include a central portion disposed between the excavations, the central portion including a top region disposed above the at least two excavations. The excavations may be structurally configured to select a fundamental transverse mode of light in the optical cavity by constricting a lateral refractive index profile of the optical cavity.

In another implementation, a method includes forming at least two excavations in a top surface of an optical cavity of a broad area quantum cascade laser, the optical cavity including an active region disposed between a top cladding and a bottom cladding, where the at least two excavations extend into at least the top cladding of the optical cavity. The method may also include altering a lateral refractive index profile of the optical cavity.

In yet another implementation, a method includes forming at least two excavations in a top surface of an optical cavity of a broad area quantum cascade laser, the optical cavity including an active region disposed between a top cladding and a bottom cladding, the at least two excavations extending into at least the top cladding of the optical cavity, and the at least two excavations structurally configured to select a fundamental transverse mode of light in the optical cavity by constricting a lateral refractive index profile of the optical cavity.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

FIG. 1A is a top view of a representation of a broad area quantum cascade laser, in accordance with the prior art.

FIG. 1B is a front view of a representation of a broad area quantum cascade laser, in accordance with the prior art.

FIG. 9 is a flow chart of a method for extracting fundamental transverse mode operation in a broad area quantum cascade laser, in accordance with a representative embodiment.

DETAILED DESCRIPTION

Figure 2:
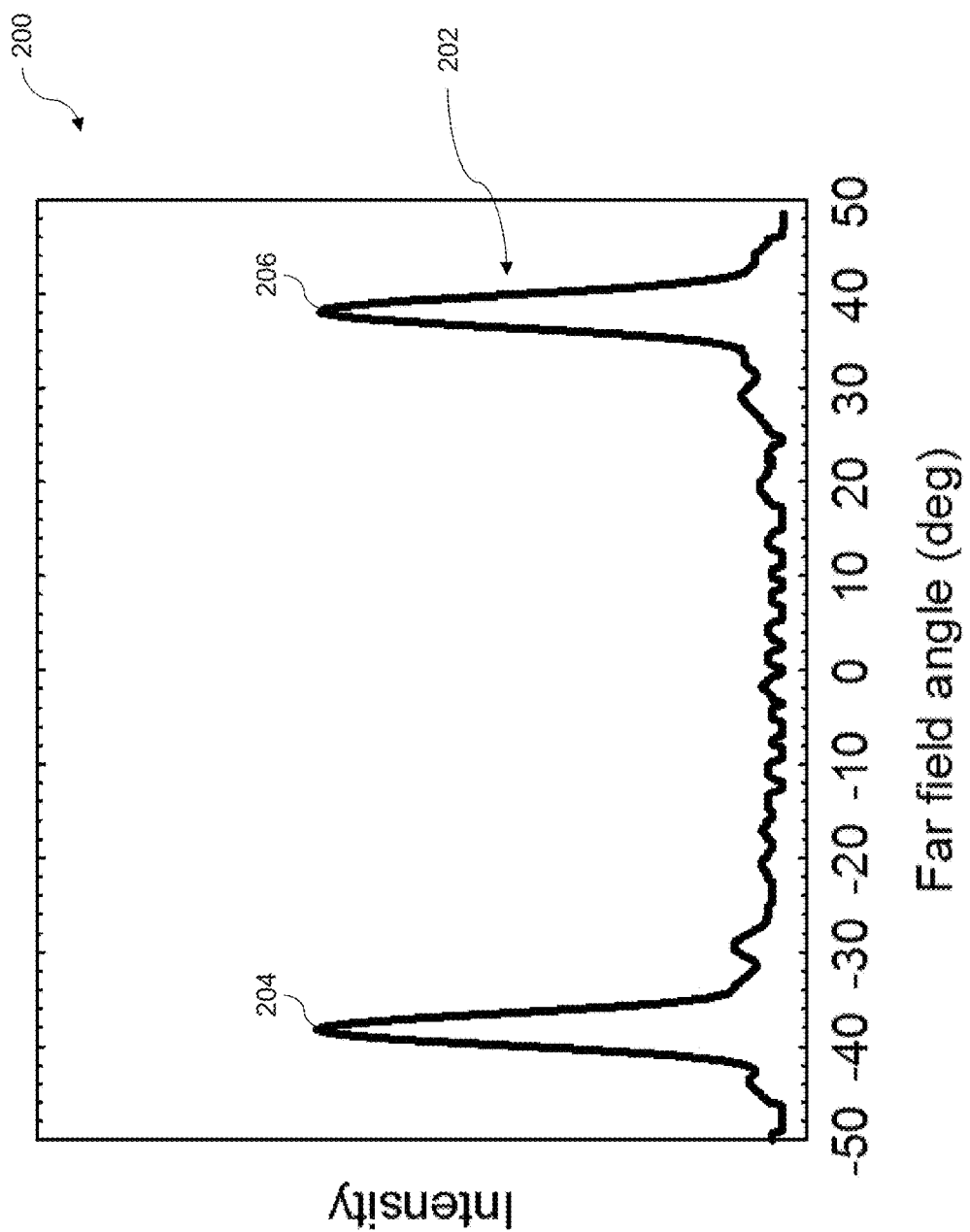
FIG. 2 is a graph showing a far field intensity profile from a broad area quantum cascade laser where a high order transverse mode is operational, in accordance with the prior art.

The various methods, systems, apparatuses, and devices described herein generally include extracting and maintaining fundamental transverse mode operation in broad area quantum cascade lasers.

While this invention is susceptible of being embodied in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

In general, the devices, systems, and methods described herein may include a broad area quantum cascade laser (BA-QCL) with fundamental transverse mode operation, and more specifically to techniques for obtaining and maintaining the fundamental transverse mode operation in BA-QCLs. As such, the disclosure relates generally to semiconductor light sources, and more particularly, to quantum cascade laser (QCL) devices that emit in the mid-infrared wavelength range (e.g., about 2 μm-20 μm), as well as long-infrared wavelength ranges, e.g., the terahertz spectral range. Techniques disclosed herein may include a BA-QCL that sustains fundamental transverse mode operation, e.g., to attain higher brightness in a single beam that is relatively easy to operate. The devices, systems, and methods disclosed herein may include any of the techniques described in R. Kaspi et al., "Extracting fundamental transverse mode operation in broad area quantum cascade lasers," APPLIED PHYSICS LETTERS 109, 211102 (Nov. 23, 2016), which is hereby incorporated by reference.

As discussed above, QCLs are unipolar semiconductor lasers that use optical transitions between electronic subbands to produce light. QCLs can be designed to emit in the mid-infrared and long-infrared wavelength ranges of the electromagnetic spectrum. Unlike typical inter-band semiconductor lasers that emit electromagnetic radiation through the recombination of electron-hole pairs across a material band gap, QCLs are unipolar, and laser emission is achieved through the use of inter-subband transitions in a repeated stack of semiconductor multiple quantum well heterostructures. By way of example, QCLs may be used in the areas of remote sensing, long-wave imaging, communications, aircraft countermeasures, and the like.

Broad area lasers generally operate spatially and longitudinally multimode, and may be used for solid-state laser pumping, sensor technology, material processing, medical applications (e.g., photodynamic therapy), as well as other applications known to those of ordinary skill in the art. Broad area laser diodes (which may also be referred to in the art as broad stripe laser diodes, broad emitter laser diodes, single-emitter laser diodes, and high power diode lasers) may include edge-emitting laser diodes where the emitting region at the front facet has the general shape of a broad stripe, with dimensions of, e.g., 1 μm×100 μm.

Thus, QCLs may be the preferred choice for a variety of applications for mid-infrared and long-infrared emission from a compact source, due to their relatively high efficiency at room temperature. Power scaling in QCLs is possible by fabricating broad area devices. However, broad area QCL devices with cavity widths that exceed approximately 10 μm typically exhibit modal instability, non-linear interactions, beam steering, and loss of brightness. When the cavity width is very large, e.g., greater than 30 μm, high order transverse modes generally result in a far field profile that is double-lobed, with each lobe propagating at large angles from the optical axis. Often a single or a small number of high order transverse modes are operational, because, unlike the typical inter-band diode laser, filamentation may be naturally suppressed in QCLs. Multi-lobed emission is a large obstacle to producing practical BA-QCL devices with high brightness.

As such, although fabricating broad area devices may be the simplest method to scale the power of QCLs, in the broad area devices, high-order transverse modes are operational and may inhibit single beam emission and reduce brightness. Thus, scaling brightness in QCLs may be severely limited by the emergence of the high order transverse modes as the laser cavity is made larger. To this end, as discussed herein, the disclosed techniques may improve upon current technologies that instead result in high-order transverse modes. For example, without using techniques disclosed herein, if a QCL was fabricated with a cavity width of approximately 50 micrometers to increase output power, the ensuing beam may have approximately half the power propagating at an angle of about +35 degrees, and the other half of the power propagating at an angle of about −35 degrees from the optical axis of the device. Such an apparently dual beam device may lose half of its potential brightness, and would be relatively difficult to operate as it will not have a single well controlled emission beam along the optical axis.

Several attempts have been made in the prior art to fabricate a BA-QCL that sustains fundamental transverse mode operation, and a few are described below by way of example. The disclosed techniques of the present teachings may include improvements over each of the following examples.

In a first example, a porous structure was incorporated in the cavity along the entire length of the BA-QCL by electrochemical etching, and this was reported to suppress higher order transverse modes—see, e.g., Zhao et al., J. APPL. PHYS. 112, 013111 (2012), which is hereby incorporated by reference. However, a porous structure is not something that can easily be incorporated into a typical QCL fabrication process.

In a second example, a gain guided BA-QCL without distinct sidewalls was demonstrated to favor fundamental transverse mode operation because high order transverse modes cannot be sustained without the sidewalls—see, e.g., Sergachev et al., OPT. EXPRESS 24, 19063 (2016), which is hereby incorporated by reference. However, in this example, due to current spreading, the divergence angle of the fundamental mode varied with the level of current injection, making the laser output characteristics become unpredictable.

In a third example, an angled cavity shape, i.e., a parallelogram with angles that are not 90 degrees, was used as a BA-QCL cavity to filter high order transverse modes—see, e.g., Heydari et al., APPL. PHYS. LETT. 106, 91105 (2015), which is hereby incorporated by reference. However, in this example, the facet angles and the cavity length must be precisely controlled in order to produce a single lobed output beam from the fundamental mode.

In a fourth example, two short trenches were placed in a narrow (w=10 micrometers) cavity QCL device to suppress the emergence of the higher order transverse mode—see, e.g., Bouzi et al., APPL. PHYS. LETT. 102, 122105 (2013), which is hereby incorporated by reference. However, as discussed above, it was concluded that high order mode suppression only occurred when the trenches were filled with a metal to provide sufficient losses to the high order mode, and no BA-QCL cavity widths were explored.

In a fifth example, BA-QCL devices emitting in the terahertz wavelength range were reported to have high order transverse modes suppression when plasmon layers at the edges of the top metal cladding were exposed to provide losses to the high order transverse modes—see, e.g., Fan et al., APPL. PHYS. LETT. 92, 031106 (2008), which is hereby incorporated by reference. However, the plasmon layers are not incorporated into QCL devices emitting at mid-infrared wavelengths.

Thus, as demonstrated by the above examples, BA-QCLs that extract and maintain fundamental transverse mode operation are desirable, particularly if compatible with mass-fabrication methods. Devices, systems, and methods described herein may be used to this end. More specifically, devices, systems, and methods described herein may suppress high-order transverse modes by forming excavations into the laser cavity that change the lateral index profile in a BA-QCL. In other words, in certain implementations, a BA-QCL may be modified by placing a local perturbation in the lateral refractive index profile in a manner that selectively favors lasing in the fundamental transverse mode, when it would not otherwise be favored. These techniques may be translatable to all commonly practiced semiconductor fabrication methods, and may result in the scaling of brightness in BA-QCLs. As a result, in certain implementations described herein, fundamental transverse mode operation in BA-QCLs can be restored, recovering single beam emission with relatively high brightness thus making them more useful in many applications.

Stated otherwise, because power scaling in BA-QCLs results in the operation of high order transverse modes with a far-field profile including two lobes propagating at large angles relative to the optical axis, disclosed herein are techniques for suppressing the high order transverse modes that can extract the fundamental transverse mode and provide emission along the optical axis. By generating localized changes in the refractive index within the waveguide in the form of short excavations, other excavations, trenches, or the like (e.g., formed by a focused ion beam milling technique), broad area devices may be provided where most of the power is contained in a near diffraction-limited beam that provides relatively high brightness.

Thus, implementations may include a BA-QCL in which the fundamental transverse mode operation can be sustained even when the cavity width is enlarged to produce higher power. Specifically, implementations may include a localized protrusion into the optical cavity (e.g., by an excavation formed therein, or otherwise a perturbation of the optical cavity) to provide a change in the lateral index profile of a BA-QCL. The precise shape and placement of an excavation of the optical cavity may provide preferential losses to the high-order transverse modes in favor of the fundamental mode.

As described herein, an index change that produces fundamental transverse mode operation may be provided by at least two excavations formed into the optical cavity, e.g., the top surface thereof. The excavations into the optical cavity may be formed by the deliberate etching of trenches in the device using an ion beam milling tool or any other tool capable of forming such excavations. The excavations may aid in providing a lateral refractive index profile that attenuates high-order transverse modes. Thus, in implementations, the net result may be the extraction of the fundamental mode, when it would not otherwise operate.

When the excavations are positioned in a predetermined and appropriate manner, e.g., they have the appropriate width, length, and depth, the excavations may modify the threshold behavior of the high-order modes such that operation of the fundamental mode is once again more favorable despite the enlarged cavity width of the BA-QCL device. It should be noted that, in certain implementations, the lateral index constriction is not an optical "aperture" because it does not block light. Instead, the fundamental mode becomes the most favorable mode because it is the least affected, while extending to the full width of the BA-QCL device. The resulting laser beam from the BA-QCL may be single lobed, aligned with the optical axis, and provide enhanced brightness. The disclosed techniques may be valid for any emission wavelength, and any method by which the excavations as described herein can be formed.

For context, FIG. 1A is a top view of a representation of a BA-QCL 100 in accordance with the prior art, and FIG. 1B is a front view of the BA-QCL 100. More specifically, FIG. 1B is a sectional view through Section A-A of FIG. 1A, where both figures show a BA-QCL 100 according to the prior art, e.g., without any perturbation of an optical cavity 110 of the BA-QCL 100.

FIGS. 1A and 1B show the optical cavity 110, which may approximate a uniform box whose geometry is defined by the cavity width 112, the cavity length 114, and sidewalls 116 that are etched to a depth below an active region 120. When the sidewalls 116 are metal terminated, which may be a typical fabrication method of BA-QCLs 100, the near field of the transverse mode in the optical cavity 110 may be described as a sinusoidal function, i.e., the solution to the Hemholtz equation, as shown by the sinusoidal curve 130 in FIG. 1B. Each of these sinusoidal functions may have a near field amplitude A(z), written as $A(z)=\sin(N\pi z/w)$, where N is the transverse mode number and w is the cavity width 112. Each of these sinusoidal functions in the near field may, in turn, produce a far-field intensity distribution in which lobes will appear at angles $\pm\Theta$, where $\Theta=\arcsin(\lambda N/2w)$, where $\lambda$, is the wavelength.

Among the many sinusoidal functions defined by N=1,2, 3, and so on, a particular one may have the most advantageous gain versus loss characteristics, and will become operational. When the cavity width 112 is relatively small (e.g., w<10 micrometers), then the most advantageous mode may be N=1, otherwise referred to as the TM00, or the fundamental mode. That is, the angle $\pm\Theta$ may be near zero degrees from the optical axis 102 of the laser, thus forming a single beam.

FIG. 2 is a graph 200 showing a far field intensity profile 202, e.g., for the BA-QCL 100 shown in FIGS. 1A and 1B, i.e., where a high order transverse mode is operational. When the width of the optical cavity 110 is relatively large (e.g. w≈90 micrometers), as in a BA-QCL 100, the most advantageous transverse mode may have a large N, and two lobes 204, 206 in the far field will be centered at +Θ and −Θ degrees from the optical axis 102, as exemplified by the data shown in FIG. 2. In this example, the far field intensity profile 202 from a BA-QCL 100 with w=100 micrometers and Λ 4.85 μm is shown. The two lobes 204, 206 are centered at about ±38 degrees, corresponding to a transverse mode number N=23. Such a high order transverse mode is schematically depicted as a generic sinusoidal curve 130 in FIG. 1B.

By way of analogy, the various transverse modes N=1,2,3, and so on, can be thought of as being in competition with each other. If all modes were equally competitive, then perhaps they could all co-exist. In certain lasers, if not equally competitive, many of these transverse modes in BA-QCLs are nearly competitive. In other words, there may only be a small preference for a particular high order transverse mode over the others. Thus, the dependence of threshold gain versus mode number may be quite shallow. In this manner, occasionally two or three different transverse modes that are nearly-competitive may co-exist in the same BA-QCL.

In the disclosed techniques, a small perturbation in the lateral index profile within an optical cavity of a BA-QCL, if placed correctly, may drastically change the mode selection behavior in the BA-QCL in favor of the fundamental mode. As discussed herein, this may be accomplished by placing at least two excavations (e.g., at least two nominally identical rectangular trenches) in the top of the device. These excavations may be located along the edges of the device, such that the center of the device is not disturbed. This is schematically shown in FIG. 3A, which is described in more detail below.

Figures 3A, 3B:
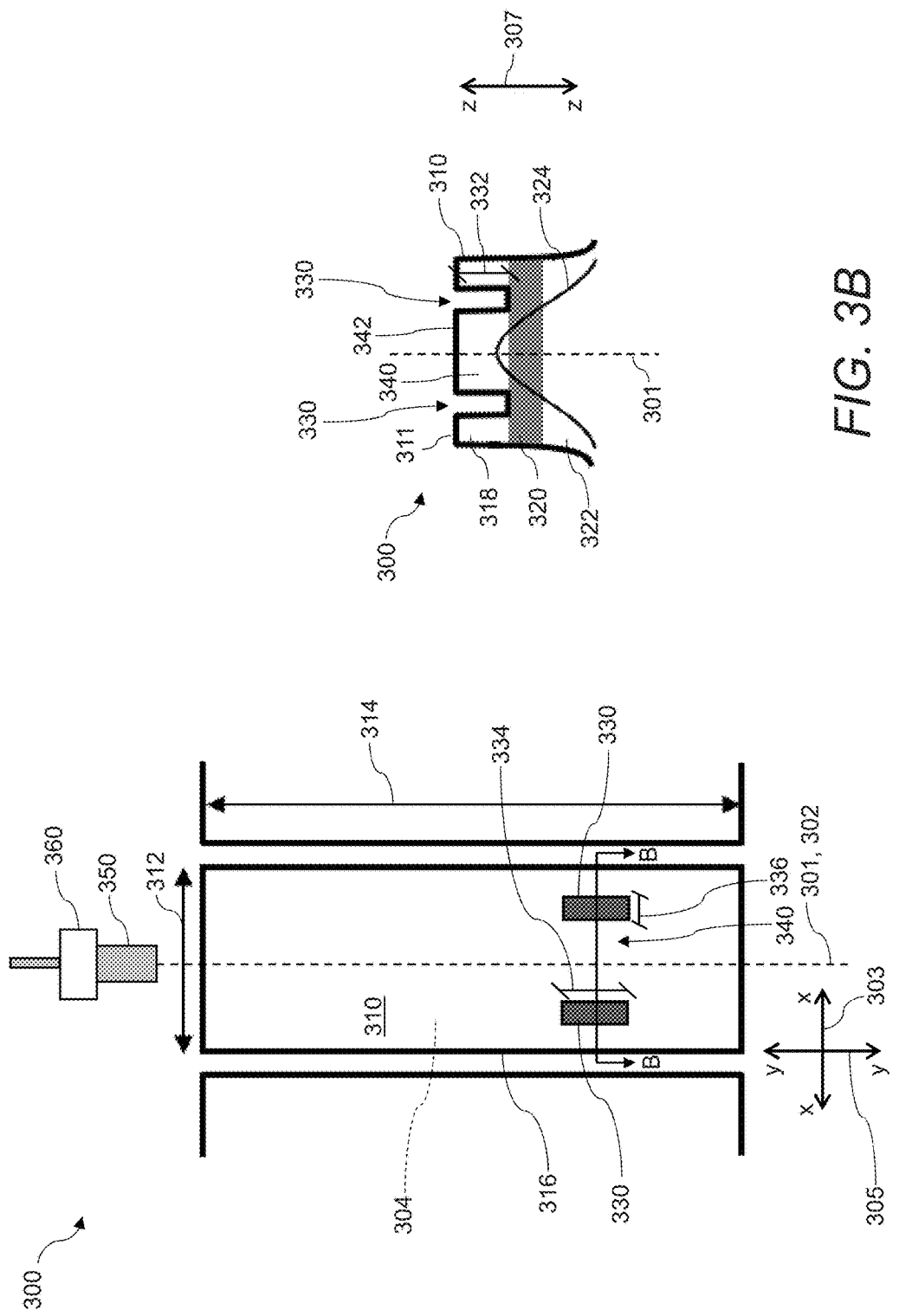
FIG. 3A is a top view of a representation of a broad area quantum cascade laser, in accordance with a representative embodiment.
FIG. 3B is a front view of a representation of a broad area quantum cascade laser, in accordance with a representative embodiment.

FIG. 3A is a top view of a representation of a BA-QCL 300, and FIG. 3B is a front view of a representation of a BA-QCL 300, in accordance with a representative embodiment. More specifically, FIG. 3B is a sectional view through Section B-B of FIG. 3A, where both figures show a BA-QCL 300 according to a representative embodiment.

The BA-QCL 300 may include an optical cavity 310, which for the sake of example may approximate a substantially uniform box whose geometry is defined by the cavity width 312, the cavity length 314, and sidewalls 316. It should be understood that FIG. 3A and FIG. 3B are not necessarily drawn to scale, and are provided by way of representation. It will be understood that the optical cavity 310 may be otherwise referred to herein as a "laser cavity" or the like. The optical cavity 310 may include an active region 320 disposed between a top cladding 318 and a bottom cladding 322. Because the device may include a BA-QCL 300, the cavity width 312 of the optical cavity 310 may be greater than or equal to 10 μm. Other dimensions for the optical cavity 310 are also or instead possible.

The BA-QCL 300 may include at least two excavations 330 formed in a top surface 311 of the optical cavity 310. The excavations 330 may extend into at least the top cladding 318 of the optical cavity 310. The excavations 330 may be structurally configured to select a fundamental transverse mode 324 of light in the optical cavity 310 by constricting a lateral refractive index profile 304 of the optical cavity 310. In certain implementations, the fundamental transverse mode 324 of the light in the optical cavity 310 would otherwise not be favored without the excavations 330. Thus, in certain implementations, without the excavations 330, high order transverse modes of the light would be present in the optical cavity 310. As such, the excavations 330 may be structurally configured to suppress the high order transverse modes of the light in the optical cavity 310. In this manner, the excavations 330 may be structurally configured to provide a loss to the high order transverse modes of the light.

The excavations 330 may include a depth 332, which may be predetermined to achieve certain properties or characteristics of light in the optical cavity 310 or emitted by the BA-QCL 300. The depth 332 may be consistent for all excavations 330 in a BA-QCL 300, or it may vary from one or more other excavations 330 in the same BA-QCL 300. Similarly, the depth 332 of the excavations 330 may be consistent across a plurality of BA-QCLs 300, or it may vary among BA-QCLs 300. In certain implementations, one or more of the excavations 330 extend beyond the top cladding 318 and into the active region 320. The excavations 330 may also or instead extend into the bottom cladding 322. Instead, the excavations 330 may be relatively shallow, extending into only the top cladding 318. In an implementation, the depth 332 of the excavations 330 is about 4.5 μm. The excavations 330 may also or instead extend into the optical cavity 310 from the bottom of the optical cavity 310, starting with the bottom cladding 322. The excavations may also or instead extend into the optical cavity 310 from its sidewalls 316.

The excavations 330 may include a size and shape that is consistent for all excavations 330 in a BA-QCL 300, or it may vary from one or more other excavations 330 in the same BA-QCL 300. Similarly, the size and shape of the excavations 330 may be consistent across a plurality of BA-QCLs 300, or it may vary among BA-QCLs 300. In certain implementations, at least one of a size, a shape, and a depth 332 of one or more of the excavations 330 is selected to alter the lateral refractive index profile 304 of the optical cavity 310 to affect mode selection that is specific to the light generated by the BA-QCL 300. The shape of one or more of the excavations 330 when viewed from above the optical cavity 310 may include a polygon. For example, as shown in FIG. 3A, the shape of one or more of the excavations 330 when viewed from above the optical cavity 310 may include a rectangle. Other shapes are also or instead possible for the excavations 330. By way of example, a shape of one or more of the excavations 330 when viewed from above the optical cavity 310 may include a curve. In this manner, the shape of one or more of the excavations 330 may include at least one of a circle, an ellipse, and an oblong shape. The effect of the geometry of the excavations 330 of the BA-QCL 300 is discussed in more detail below.

The BA-QCL 300 may include a central portion 340 disposed between the excavations 330. The central portion 340 may include a top region 342 disposed above the two excavations. In other words, the central portion 340 may form a plateau disposed between the excavations 330 that is disposed at a height along a z-axis 307 that is above the bottom of the excavations 330 defined by the depth 332. A longitudinal centerline 301 of the optical cavity 310 may be disposed through the central portion 340 between the excavations 330. As shown in FIG. 3A, the longitudinal centerline 301 may be disposed along an optical axis 302 of the optical cavity 310 when viewed from above.

The light beam outside of the optical cavity 310 may include one or more lobes of intensity propagating in different directions that are generated by the BA-QCL 300. Thus, in certain implementations, the excavations 330 may be structurally configured to provide primarily a single-lobed laser beam 350 outside of the optical cavity 310. The single-lobed laser beam 350 may be substantially aligned to the optical axis 302 of the optical cavity 310. In certain implementations, the single-lobed laser beam 350 is relatively brighter than a counterpart laser beam would be if the counterpart laser beam was passed through a similar optical cavity that lacks the excavations 330. Thus, the excavations 330 may create a brighter single-lobed laser beam 350 than an optical cavity lacking such excavations 330. Also, in this manner, the light in the optical cavity 310 may include a mid-range infrared wavelength. For example, the light may include a wavelength in a range of 2 µm to about 20 µm. The light in the optical cavity 310 may also or instead include a long-wave infrared wavelength. For example, the light may include a wavelength of at least 1 terahertz. Other wavelengths are also or instead possible for the light in the optical cavity 310.

Some other characteristics of the excavations 330 will now be described.

The excavations 330 may be structurally configured to achieve a higher brightness of the light (e.g., the single-lobed laser beam 350) outside of the optical cavity 310. In this manner, the excavations 330 may be structurally configured to improve the beam-quality of the emitted light to achieve higher brightness of a laser beam outside of the optical cavity 310.

As discussed above, the excavations 330 may be different from an aperture. In other words, the excavations 330 may not block light from passing therethrough. Instead, the BA-QCL 300 may further include an optical aperture 360 downstream of the optical cavity 310. Thus, the constriction of the lateral refractive index profile 304 provided by the excavations 330 may not be the same as providing an optical aperture 360. Instead, the resulting beam divergence as a result of placing the excavations 330 may approach a near diffraction-limited beam originating from the fundamental mode occupying the entire width of the BA-QCL 300.

One or more of the optical cavity 310 and the excavations 330 may lack metal. For example, the excavations 330 may define voids, where the voids lack any additional material after they are formed. In this manner, the excavations 330 may not be refilled with any material after formation thereof. In other implementations, the excavations 330 are refilled with material after formation thereof. Thus, the excavations 330 do not have to remain unfilled. If filled with a material such as a metal, an insulator, or oxides, the disclosed techniques may not change because the lateral index profile should continue to provide benefits as disclosed herein. Thus, changing the refractive index within the excavations 330 may only be dependent upon the geometry of the excavations 330, which can be optimized accordingly.

By way of example, in an implementation where one or more of the excavations 330 are substantially shaped as rectangles such as that shown in FIG. 3A, a length 334 of an excavation 330 may be about 150 µm, and a width 336 of the excavation 330 may be about 30 µm. In such an implementation, or in other implementations, the central portion 340 disposed between the excavations 330 is about 24 µm wide. The rectangular or box-shaped excavations 330 may be defined by their length 334, width 336, and depth 332. It will be understood that in this example embodiment (i.e., the embodiment shown in FIG. 3A), the number of the excavations 330 and the dimensions of the excavations 330 are provided for illustrative purposes only and not by way of limitation. In FIG. 3A, two excavations 330 are shown placed on the BA-QCL 300, which may have a cavity width 312 of about 90 micrometers and a cavity length 314 of about 3 millimeters, e.g., the same as the unperturbed device that produced the data in the graph 200 of FIG. 2. In this example embodiment of FIG. 3A, and as discussed above, the length 334 of the excavations 330 may be about 5% of the cavity length 314 of the BA-QCL 300.

The alignment of the excavations 330 may be selected such that the excavations 330 perform various functions in the optical cavity 310 of the BA-QCL 300 as described herein. In an implementation, the excavations 330 are aligned substantially parallel relative to one another. For example, the excavations 330 may be aligned substantially parallel to an optical axis 302 of the optical cavity 310. The excavations 330 may instead be substantially aligned along an axis substantially perpendicular to an optical axis 302 of the optical cavity 310, e.g., the x-axis 303. The excavations 330 may be disposed at the same location along the cavity length 314, or one or more of the excavations 330 may be disposed at different locations along a length of the optical cavity 310, e.g., along the y-axis 305.

As discussed above, the excavations 330 may be formed by using an ion beam milling tool or any other tool capable performing a deliberate etching, ablation, cutting, or removal of material, e.g., photolithographic etching or plasma etching, ion implantation, selective current injection, and so on. One of ordinary skill will recognize that other manufacturing tools and techniques may be used to create the excavations 330, and any of which may be used in conjunction with the devices, systems, and methods described herein. Therefore, the formation of the excavations 330 can be accomplished by a variety of techniques that include standard photolithographic etching methods, which are routinely incorporated into the mass fabrication methods for QCL devices. The method or tool used to form the excavations 330 may not affect the results, e.g., the experimental example results discussed herein.

The number of the excavations 330 included in the optical cavity 310 may be selected such that the excavations 330 extract certain performance of the light in the optical cavity 310 of the BA-QCL 300 as described herein. In certain implementations, the optical cavity 310 may include at least two excavations 330, at least four excavations 330, at least eight excavations 330, and so on. The excavations 330 may be split in groupings or pairs, e.g., on opposite sides of the central portion 340 or a plane intersecting the central portion 340, e.g., on opposite sides of a plane substantially disposed along the y-axis 305 and the z-axis 307. Other numbers for the excavations 330 are possible, including an odd number of excavations 330. Also, in an implementation, only a single excavation 330 is present.

In certain implementations, each excavation 330 in the optical cavity 310 is substantially identical. In other implementations, one or more of the excavations 330 are different, e.g., including at least one of a different size, shape, or depth 332 as one or more other excavations 330 in the optical cavity 310.

Thus, in certain implementations, the BA-QCL 300 of FIGS. 3A and 3B, and as otherwise described herein, may be subject to having high order transverse optical modes during operation, where the BA-QCL 300 includes a laser cavity enclosed by walls (e.g., the optical cavity 310 and sidewalls 316 shown in the figure). The BA-QCL 300 may further include a perturbation in the laser cavity extending from one or more of the walls, where the perturbation has a shape and a size sufficient to suppress high order transverse optical modes during operation of the BA-QCL 300, whereby a fundamental transverse optical mode is selected over the high order transverse optical modes.

The perturbation described directly above may be in the form of one or more excavations 330 as described herein, e.g., a plurality of excavations 330. However, in general, the perturbation may include any modification to the laser cavity that acts to suppress high order transverse optical modes during operation of the BA-QCL 300. In this manner, the perturbation may include a change to the laser cavity including without limitation one or more of a change in material, a physical change, a mechanical property change, an electrical property change, a radiation change, a chemical change, and the like. It should also be noted that, depending upon perspective, the perturbation may be thought of as a protrusion, e.g., when an excavation 330 is viewed from the perspective of an interior of the optical cavity 310, and the excavation 330 protrudes into the interior of the optical cavity 310. Thus, in certain implementations, the perturbation includes one or more excavations 330, but other forms of perturbations that modify the laser cavity to suppress high order transverse optical modes during operation of the BA-QCL 300 are also or instead possible.

As discussed herein, the laser cavity may have a lateral refractive index profile 304, where one or more of the shape and the size of the perturbation is selected to modify the lateral refractive index profile 304. The laser cavity may include an active region 320 structurally configured to produce photons, where the perturbation extends into the active region 320.

As discussed above, the perturbation may be in the form of a plurality of excavations 330. In certain implementations, each of the plurality of excavations 330 includes an identical shape and size. Each of the plurality of excavations 330 may include a shape and a size selected so that the plurality of excavations 330 collectively modify the lateral refractive index profile 304 of the laser cavity.

As discussed herein, the laser cavity may include an optical axis 302. In certain implementations, the plurality of excavations 330 are structurally configured to collectively select the fundamental transverse optical mode over high order transverse optical modes, whereby the BA-QCL 300 emits a laser beam having a single lobe aligned with the optical axis 302 (i.e., the single-lobed laser beam 350 shown in the figure). In certain implementations, the high order transverse optical modes and the fundamental transverse optical mode are orthogonal to the optical axis 302. A first plane may intersect the optical axis 302, e.g., a first plane 303 that is disposed along the x-y plane, i.e., a plane disposed along both the x-axis 303 and the y-axis 305 shown in the figure. The excavations 330 may be disposed along the first plane (e.g., the x-y plane), or the first plane may otherwise intersect at least a portion of one or more of the excavations 330. A second plane (also intersecting the optical axis 302) may be disposed orthogonal to the first plane. The second plane may be disposed along the y-z plane, i.e., a plane disposed along both the y-axis 305 and the z-axis 307 shown in the figures. Thus, an edge of the second plane could be represented by the centerline 301 shown in FIG. 3B. In certain implementations, an equal number of the plurality of excavations 330 is disposed on either side of the second plane. For example, the plurality of excavations 330 may include a pair of excavations 330, where a gap is disposed between a first excavation in the pair of excavations 330 and a second excavation in the pair of excavations 330. The gap may be defined by the central portion 340 that is shown in the figures. Thus, in an implementation, the second plane intersects the optical axis 302 and bifurcates the gap, where the first excavation is disposed on one side of the second plane at a first distance from the second plane, and the second excavation is located on a second side of the second plane, also at the first distance from the second plane 305. Other configurations are also or instead possible, such as where the distance from the second plane is not equal for one or more of the excavations 330.

Figure 4:
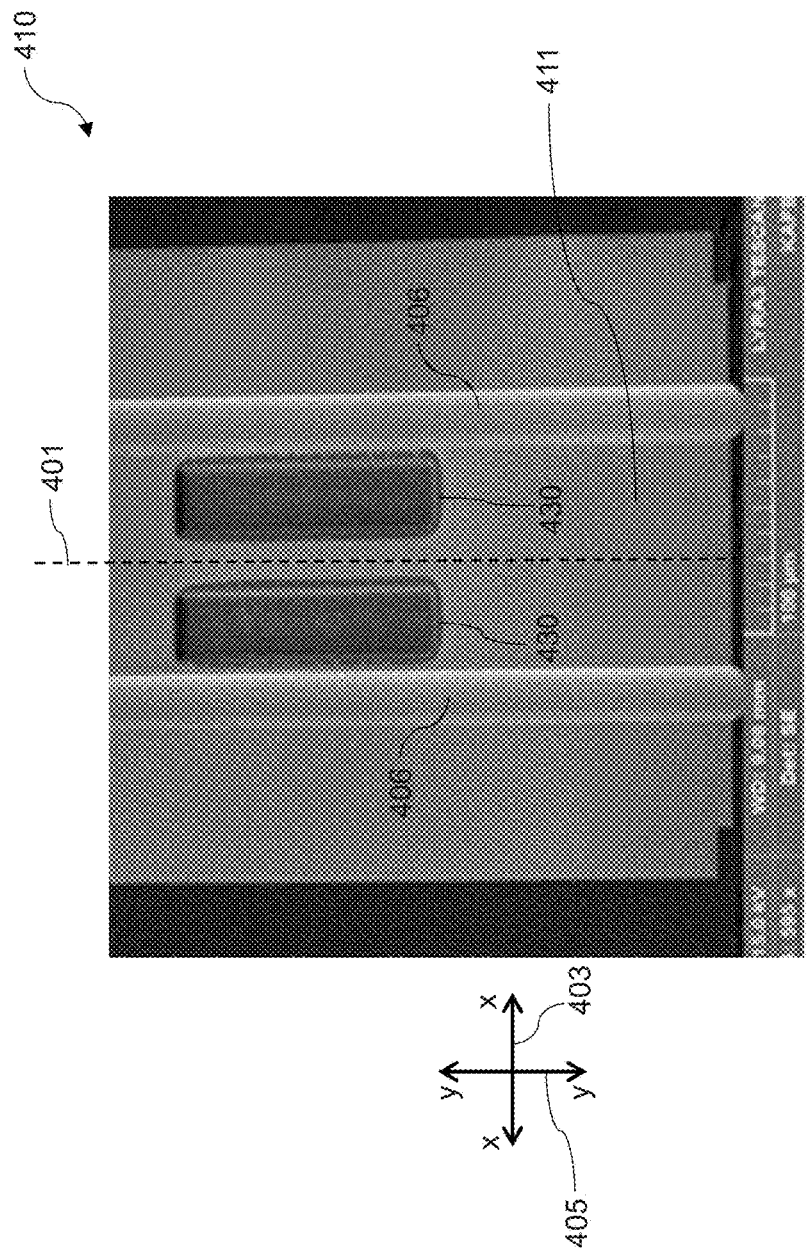
FIG. 4 is a top view of a portion of a broad area quantum cascade laser, in accordance with a representative embodiment.

FIG. 4 is a top view of a portion of a BA-QCL, in accordance with a representative embodiment. More specifically, FIG. 4 is an image taken by an electron microscope of a top view of an optical cavity 410 with two (substantially rectangular) excavations 430 formed on a top surface 411 thereof. For context and perspective, also shown in FIG. 4 are the centerline 401 (which may be disposed along the optical axis), the x-axis 403, and the y-axis 405. The BA-QCL device shown in the figure was fabricated using a double-channel scheme where two channels 406 are etched below the active region to define the lateral sidewalls of a cavity with cleaved facets. In the example embodiment shown in FIG. 4, a focused ion beam (FIB) tool directed a 5 kV Ga ion beam onto the surface of the BA-QCL device to remove material from the designated area in the shape of the substantially rectangular excavations 430.

Presented herein by way of example with reference to FIGS. 5-8, is a systematic empirical study of how the geometry of the excavations can affect the far field pattern, as well as the threshold and power characteristics of the BA-QCL device. In these examples, the QCL devices under study were fabricated from structure grown by gas source molecular beam epitaxy on an n– InP(001) substrate. The strain compensated active region was designed to emit near 4.85 μm, and included 30 stages with multilayer GaInAs/AlInAs injector regions in each stage. The InP top clad included an approximately 3 μm thick layer with the carrier concentration rising from about $10^{16}/cm^3$ to $10^{17}/cm^3$, and an additional approximately 1 μm thick layer of n+ InP with $10^{19}/cm^3$. The BA-QCL devices were fabricated using a double-channel scheme where two relatively deep channels were etched below the active region that define the lateral sidewalls of an otherwise uniform cavity with cleaved facets. After depositing the insulating layers and the contact metal, an additional approximately 5 μm thick layer of gold electroplating was deposited, except in a small section near the facets of the device to allow for ease of facet cleaving. The devices were mounted without facet coatings, in the epi-up configuration, and tested at room temperature in the pulsed regime using 500 ns pulses with a duty cycle of 0.5% to minimize heating. In the examples, the peak power may be estimated by measuring the average power using a calibrated thermopile detector and multiplying by 200 to reflect the duty cycle. Far field measurements were conducted with a point detector mounted on a motorized rotating pivot arm about 30 cm away from the device.

Figure 5:
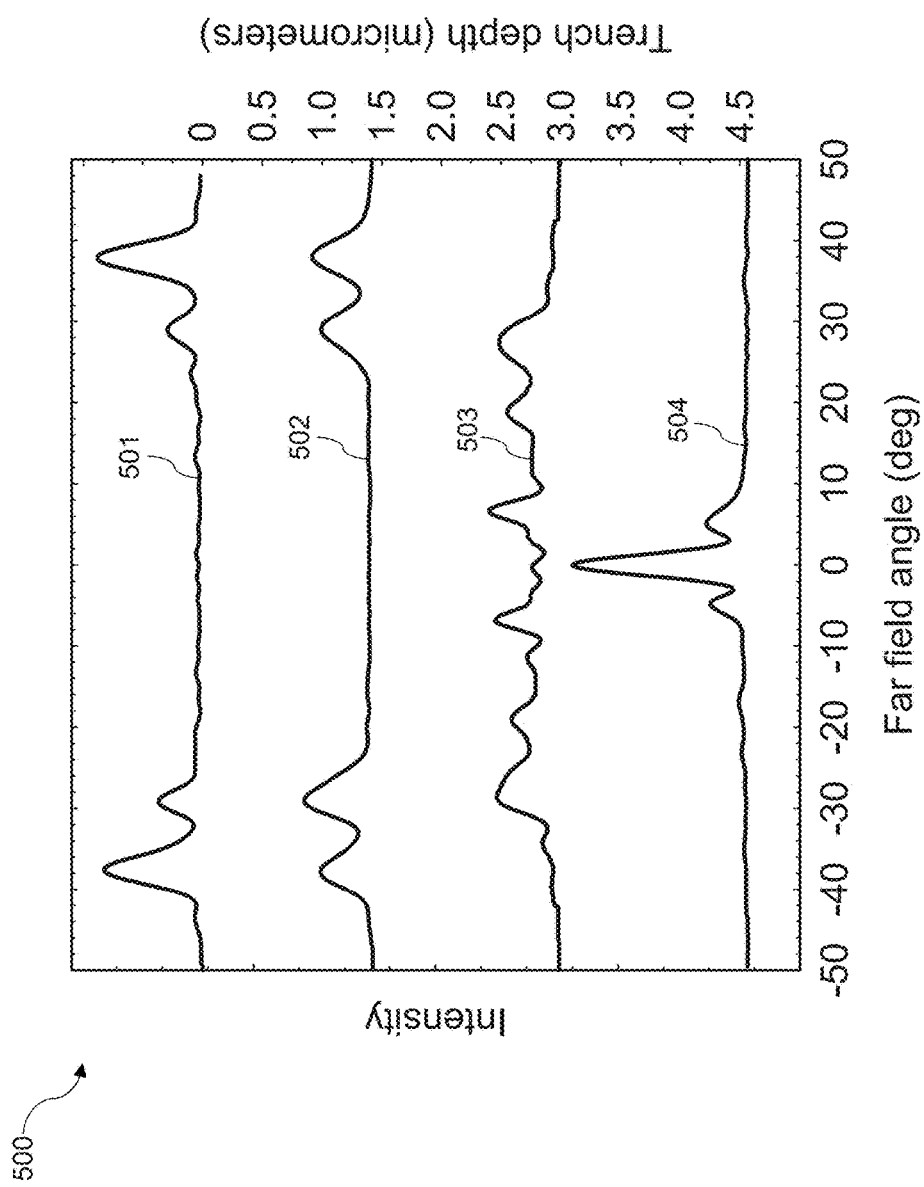
FIG. 5 is a graph showing far field measurement as a function of excavation depth, in accordance with representative embodiments.
Figure 6:
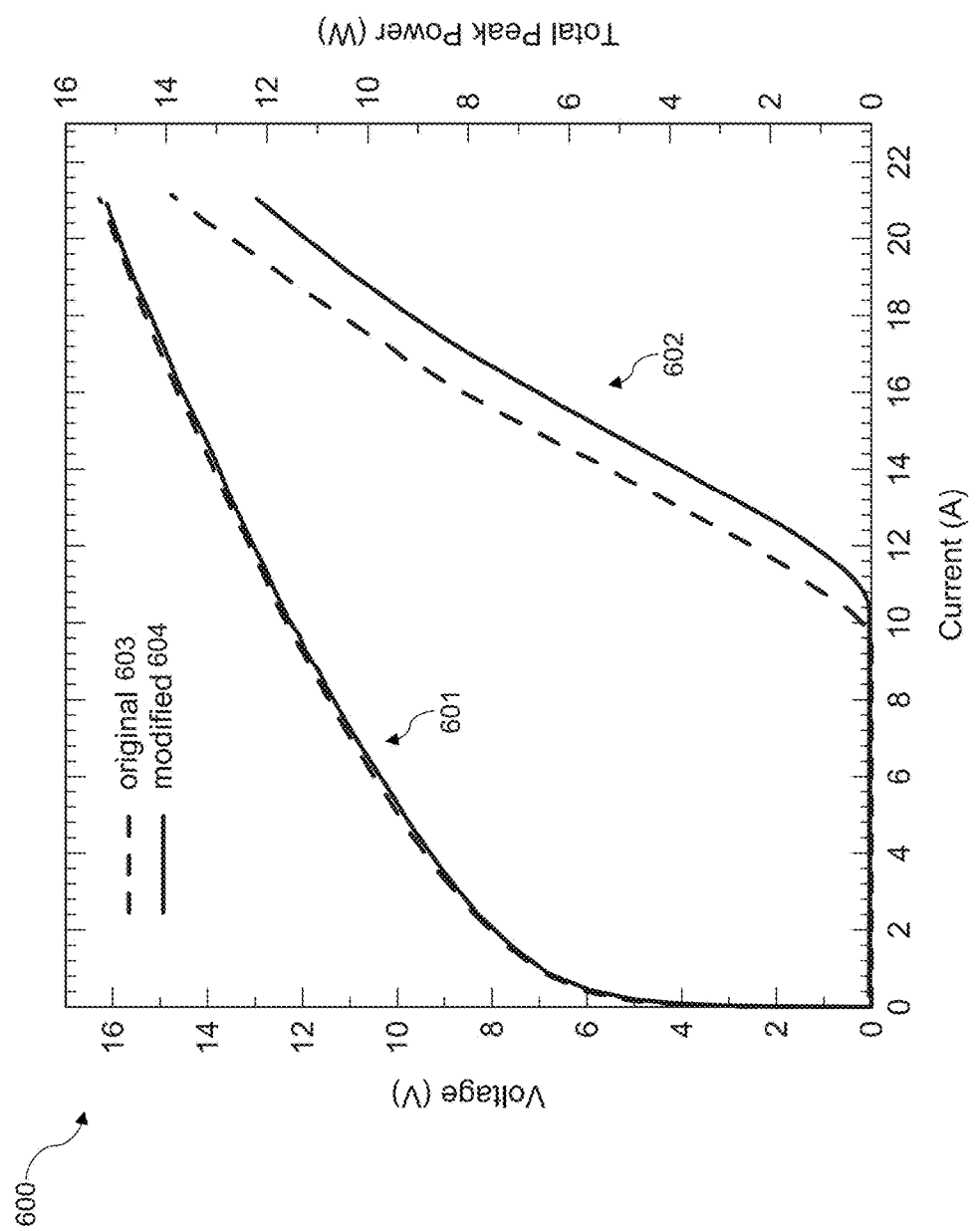
FIG. 6 is a graph showing current versus voltage, and current versus output power, for both an unmodified broad area quantum cascade laser of the prior art and a modified broad area quantum cascade laser in accordance with a representative embodiment.

In the example experiment shown in FIGS. 5 and 6, the effect of the depth of the excavations 430 (e.g., in the optical cavity 410 of the BA-QCL of FIG. 4) on the transverse mode behavior was explored. It will be understood that the ideal geometry of the excavations 430 may be found by optimizing the length as well as the width and the depth of the excavations 430 with respect to the width of the optical cavity 410 of the BA-QCL, such that the desired balance between suppressing high order modes while minimizing the losses to the fundamental mode can be achieved. The example excavation depth study conducted in FIGS. 5 and 6 may provide empirical data that can be helpful to future calculations of mode behavior based on the strength of index coupling.

As shown in FIG. 4, in this example excavation depth study, a single pair of substantially rectangular excavations 430, about 150 µm in length separated by about 24 µm, were included on a BA-QCL device with a width of about 90 µm. For obtaining the data of FIGS. 5 and 6, the excavations 430 were progressively milled after each measurement of the far field spectrum. The image in FIG. 4 shows the placement of the excavations 430 relative to the back facet of the BA-QCL device. Far field spectra collected after each incremental removal of material is shown in FIG. 5. For clarity, the background level of each spectrum is placed at the y-axis value on the graph 500 indicating the estimated depth of that particular excavation 430.

Thus, FIG. 5 is a graph 500 showing far field measurement as a function of excavation depth, in accordance with a representative embodiment. In the graph 500, for the purpose of illustration, the depth of the excavations (labeled as "Trench depth (micrometers)" on the graph 500) is varied to show examples of the effect on high order transverse mode selection in a BA-QCL, e.g., a BA-QCL having an optical cavity 410 as shown in FIG. 4. In these examples, after each new depth, the BA-QCL device was re-tested in an identical manner, and the far field angle was measured, where the far field angle measurement as a function of the depth of the excavations is shown in the FIG. 5.

As shown in FIG. 5, initially, the BA-QCL device without any modifications exhibits two distinct pairs of lobes in the first far field 501. This demonstrates that two high order transverse modes are very nearly competitive with each other, and co-exist. Once the excavations are formed, it is apparent from the figure that the local lateral index constriction may be capable of influencing high order transverse mode selection, with lower mode numbers N being favored as the excavations become deeper. Specifically, this is demonstrated in the example by the first far field 501, the second far field 502, the third far field 503, and the fourth far field 504 shown in the graph 500.

Therefore, as shown in FIG. 5, prior to creation of the excavations 430, the device exhibited two distinct transverse modes that were operational. As the depth was increased, a gradual suppression of high order transverse modes in favor of the fundamental mode was observed. Specifically, it was observed that between 0 and about 2.5 µm of depth, the excavations 430 had a relatively small effect on mode selection, primarily changing the relative intensity of the two transverse modes in favor of the mode with the lower mode number and smaller angle. At depths of about 3 and about 3.5 µm, the far field spectra indicated the presence of a larger number of transverse modes that become competitive as the higher order modes were suppressed. As the excavations 430 reach into the active region, the emergence of the fundamental mode where the majority of the laser power is contained was observed. The optimal depth, in this example experimental case, was observed to be near 4.5 µm from the surface, which was well inside the active region. This geometry represented a point where the losses were most selectively induced on the higher order modes, while the effect on the fundamental mode remained small. It is noted that, in the example experiment, even in this case, the M=2 mode was still evident. Finally, when the depth was extended even further from the surface (e.g., about 5.4 µm), well near the bottom of the active region, a return to multi high-order mode operation was observed. This geometry is presumably where high order modes residing only along the unconstrained length of the cavity are preferred.

In summary, in this example embodiment, the optimal depth corresponds to an excavation depth approximately half way down the active region, nearly 4.5 micrometers form the top surface. At this excavation depth, the BA-QCL device was observed to emit primarily with the fundamental transverse mode as shown in the fourth far field 504. Any additional depth increases may degrade the laser in the BA-QCL device.

The results shown in FIG. 5 can be explained by the selective nature of the localized index profile in this example embodiment. The lateral index profile has a similar shape to the lateral physical profile, e.g., shown as the cross-section profile at Section B-B in FIGS. 3A and 3B. The high refractive index of the BA-QCL device material was also locally reduced wherever material is removed. Thus, the resulting index profile may favor transverse modes that have the least overlap with the perturbations, such as the fundamental mode that has an intensity distribution that is only peaked in the center, and disfavors modes that have higher overlap with the perturbations such as the higher order transverse modes.

The specifics of the unaltered BA-QCL device, and the specific geometry of the excavations, may together determine the selection of transverse modes. A salient feature of the disclosed devices, systems, and methods may be that any excavation geometry can be successful if it can provide the selectivity to allow the operation of the fundamental transverse mode in the BA-QCL device. Thus, in implementations, a variety of geometries are possible for the excavations as described herein.

FIG. 6 is a graph 600 showing current versus voltage (represented by a first set 601 of curves), and current versus output power (represented by a second set 602 of curves), for both an unmodified BA-QCL 603 (e.g., of the prior art) and a modified BA-QCL 604 (e.g., in accordance with a representative embodiment). Specifically, FIG. 6 shows laser characterization curves (the first set 601 and the second set 602 of curves) comparing an unmodified BA-QCL 603 (i.e., before a perturbation is placed in the laser cavity—e.g., the excavations as explained herein) to the same BA-QCL after a perturbation is placed in the laser cavity (i.e., the modified BA-QCL 604). Thus, the first set 601 of curves show the current through the BA-QCL as a function of the voltage that is provided to get that current, and the second set 602 of curves shows the total power emitted from the BA-QCL as a function of the current through the BA-QCL, where the threshold current is the minimum current before getting any light from the BA-QCL, and the slope efficiency is the slope of the power versus current curve. As explained in more detail below, the graph 600 demonstrates that a BA-QCL with the perturbation has a slightly higher threshold current, and a slightly lower slope efficiency, but the resulting drop in emitted power is only about 10% at the maximum current shown, which is not relatively large.

For the data shown in the graph 600, which is provided by way of example, a BA-QCL device with w≈90 µm was mounted uncoated in an epi-up configuration for testing at room temperature using 500 ns pulses at 0.5% duty cycle. After initial characterization, two rectangular excavations were milled to a depth of about 4.5 µm in a geometry similar to that shown in FIG. 4. A comparison of power-current-voltage (LIV) characteristics are shown in FIG. 6, where a relatively small<10% increase in the threshold current, and a minimal change in the slope efficiency, were observed in this example experiment. It should be noted that the far field spectra showed no discernible change in the transverse mode structure as a function of injection current, and more than 95% of the total power was contained within a divergence angle of ±10 degrees from the optical axis. With only about a 13% drop in power at the maximum current tested, the modified BA-QCL 604 was able to reach high power with high brightness in a usable form, which was not previously available in the unmodified BA-QCL 602.

There may be two concerns when altering the mode behavior in a BA-QCL in a manner disclosed herein, but each of these concerns can be ameliorated as discussed below. The first concern may include whether the alteration causes the BA-QCL to lose power or some other feature that will make it substantially less desirable. As shown in FIG. 6, the example experimental results indicate that the modified BA-QCL 604 may exhibit an approximately 10% increase in threshold current, and an approximately 13% drop in output power at the same injection current. However, due to the operation of the fundamental transverse mode, and the ensuing improvement in beam quality, the brightness of the modified BA-QCL 604 may be increased by approximately four-fold, thus alleviating this concern.

A second concern when altering the mode behavior in a BA-QCL in the manner disclosed herein may include whether the benefits are too sensitively affected by the excavation geometry, and that the proper excavation geometry may be difficult to duplicate. To better understand this sensitivity, an example embodiment of how the excavation geometry effects mode selection is provided below.

Figure 7:
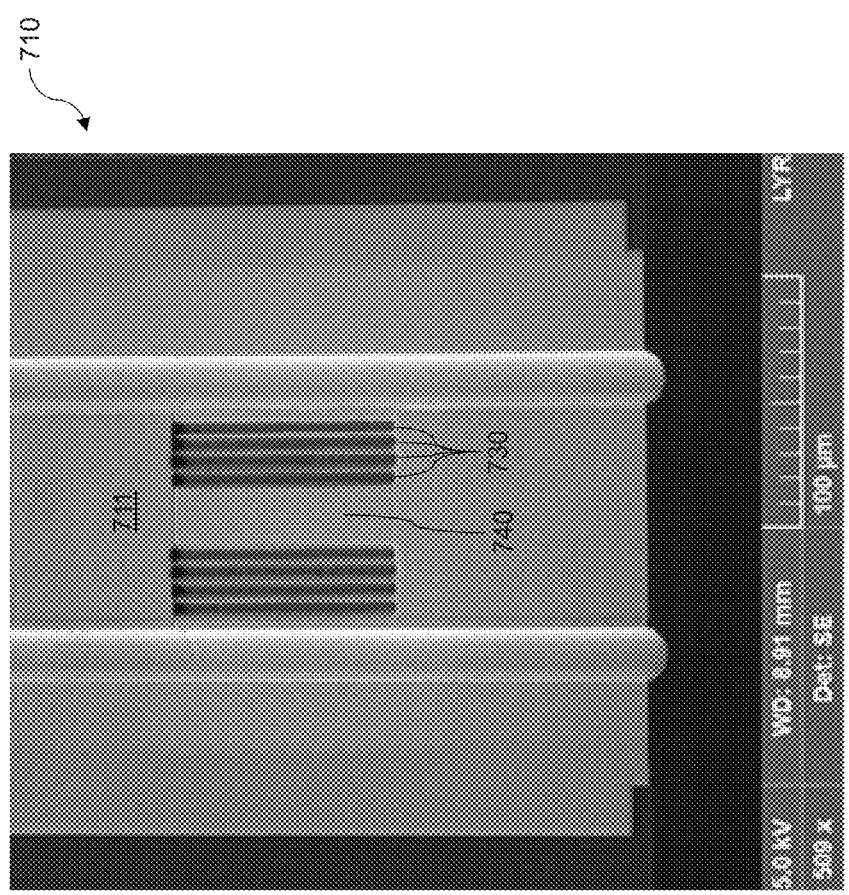
FIG. 7 is a top view of a portion of a broad area quantum cascade laser, in accordance with a representative embodiment.

By way of example, the far field emission profile from the same BA-QCL device is compared after an additional pair of narrow excavations are placed adjacent to the previous pair, where each excavation has substantially the same nominal depth. FIG. 7 is a top view of a portion of a BA-QCL, in accordance with a representative embodiment. More specifically, FIG. 7 is an image taken by an electron microscope of a top view of an optical cavity 710 with pairs of excavations 730 formed on a top surface 711 thereof, i.e., after placing four pairs of excavations 730 in the example experiment being discussed. In this example, each individual excavation 730 is approximately 5 micrometers wide and 150 micrometers long. After four pairs of excavations 730 are placed in the optical cavity 710, the central portion 740 is approximately 24 micrometers wide.

Figure 8:
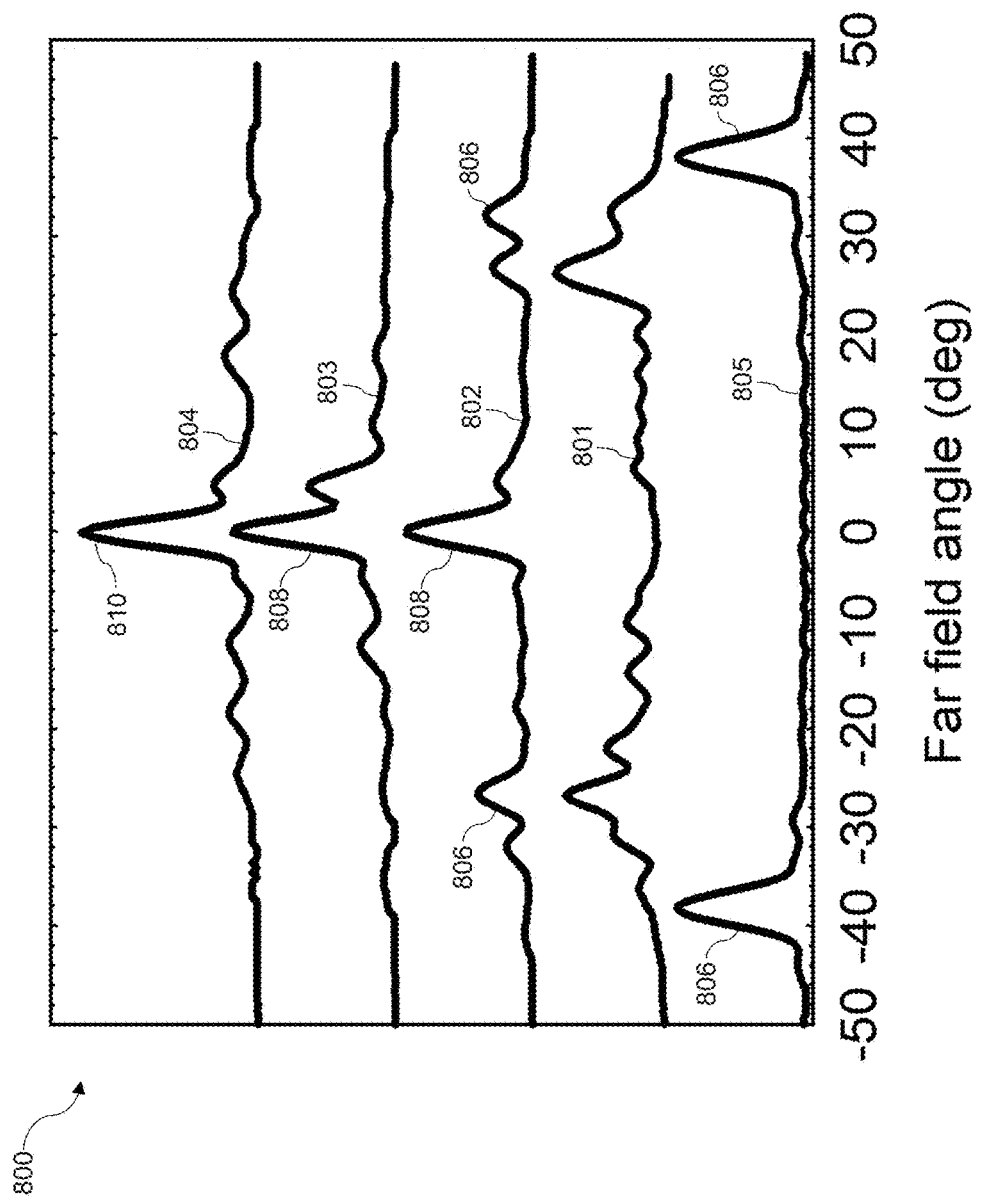
FIG. 8 is a graph showing far field profiles of laser beams, in accordance with representative embodiments.

In the example shown in FIGS. 7 and 8, the experiment was conducted on a device with w≈90 μm and a nominal cavity length of 3 mm. After initial characterization, four pairs of excavations 730 were etched near the back facet, one pair at a time, starting from the outer edge of the device. Each trench was approximately 5 μm wide, 150 μm long, and 4.5 μm deep, completely contained in the region without a thick gold deposition. After the fourth pair, the unaffected area (i.e., the central portion 740) between the excavations 730 was approximately 24 μm. In FIG. 8, the far field spectra collected after etching each pair of excavations 730 are shown in this example experiment.

FIG. 8 is a graph 800 showing far field profiles of laser beams, in accordance with representative embodiments. Specifically, FIG. 8 shows the far field profile of a laser beam before and after each of the pairs of excavations 730 are placed in the optical cavity 710 of FIG. 7. That is, FIG. 8 shows: an original far field profile 805 representing an original, unaltered BA-QCL device; a first far field profile 801 representing a single pair of excavations; a second far field profile 802 representing two pairs of excavations; a third far field profile 803 representing three pairs of excavations; and a fourth far field profile 804 representing four pairs of excavations. As shown in the original far field profile 805 of the graph 800, in the original unaltered BA-QCL device, only a high order transverse mode 806 is active. As shown in the second far field profile 802 of the graph 800, after two pairs of excavations are placed in the optical cavity, the fundamental mode 808 co-exists with a selection of other higher order transverse modes 806. As shown in the third far field profile 803 of the graph 800, after the third pair of excavations is placed in the optical cavity, most of the power is emitted in the fundamental mode 808. As shown in the fourth far field profile 804 of the graph 800, the fourth pair of excavations produces a relatively cleaner, single peak profile 810.

This particular example embodiment, and the resulting data, illustrate that while the mode selection is affected by the geometry, the sensitivity may not be not very acute. This suggests that excavations with many other shapes or depths can be formed to provide a level of mode selectivity that will satisfy a BA-QCL designer, which can alleviate the second concern discussed above. For example, excavations that are shallower, but longer, may provide a similar effect. Therefore, only a small perturbation in the optical cavity may have beneficial effects.

Thus, the results shown in FIGS. 7 and 8 indicate a very strong influence of the excavations 730 on the transverse mode selection in the device, where the lateral constrictions provide preferential losses to the higher order modes. Without the excavations 730, the device exhibits two lobes at ±38 degrees that is indicative of a single stable high order transverse mode described by $\sin \Theta = (\lambda M)/(2w)$, where mode number M=23, $\Theta$ is the emission angle of the lobes, and $\lambda$ is the wavelength. In this example experiment, the first pair of excavations 730 is sufficient to disrupt this transverse mode, resulting in a selection of lower order modes that are simultaneously oscillating, with no clear dominant mode. This suggests that the various transverse modes are nearly competitive with each other, and can be rather easily influenced by small geometric disruptions in the optical cavity 710. In this example experiment, only two pairs of excavations 730 are able to extract the fundamental mode. The additional pairs of excavations 730 may help suppress most other transverse modes such that the power is primarily contained in the central lobe as seen in FIG. 8.

The angular half-width of the central lobe from the w≈90 μm device may be approximately 47 mrad, giving a beam parameter product (BPP) of about 2.1 mm*mrad. For comparison, a diffraction limited Gaussian beam from this device lasing at λ≈4.85 μm should have a BPP of 1.54 mm*mrad. Measurement errors notwithstanding, this suggests that a beam that is better than 1.5 times the diffraction limit in the transverse direction may be achieved. This may also imply that the fundamental mode extends across the entire width of the BA-QCL cavity.

For a more complete empirical optimization of the geometry of excavations, considerations may include the length of the excavations, their shape, and their position along the BA-QCL cavity. Given that the BA-QCL cavity width, cavity length, wavelength, and gain spectrum may also play a role, rigorous modeling of the perturbation to each mode will, in principle, directly guide a BA-QCL designer to an optimized geometry. Sufficient information may also or instead be available to fabricate a nearly-optimized BA-QCL device by a direct comparison of operational characteristics.

Mathematical modeling may thus be used to make predictions to fine tune the geometry of the excavations for greater effect. While such modeling is not discussed in detail herein, a BA-QCL designer may apply the disclosed techniques regardless of the wavelength, geometry, and quality of an unaltered BA-QCL device. Thus, while a predictive model that ties the geometry of the excavations to mode selection in BA-QCLs may be useful, even the example experimental data provided herein shows that only a small perturbation can cause large changes in mode selection. Therefore, the high order transverse modes and the fundamental mode may be very nearly competitive with each other in BA-QCLs, where the dependence of threshold gain with mode number is somewhat weak in the unperturbed device. As a result, a vast array of geometries may have a similar effect.

Therefore, as described herein, and in particular as demonstrated in the example experiments described above, large changes in the transverse mode selection in BA-QCL devices may be induced by introducing pairs of excavations, e.g., generated by focused ion beam milling, in small portions of the BA-QCL device. The proximity of the excavations and their depth may have a critical influence, and if selected properly, the excavations may extract most of the emitted power from the fundamental mode that was not favored in an unaltered BA-QCL device. Further optimization of the excavation geometry may produce an even better balance between a purer fundamental mode and change in threshold current and slope efficiency. Once optimized, the formation of excavations may be easily incorporated into a photolithographic fabrication process or the like.

FIG. 9 is a flow chart of a method for extracting fundamental transverse mode operation in a BA-QCL, in accordance with a representative embodiment.

As shown in block 902, the method 900 may include selecting properties for a perturbation (e.g., an excavation) to be created in the optical cavity of a BA-QCL device. For example, this may include selecting at least one of a size, a shape, and a depth of one or more excavations to alter the lateral refractive index profile of the optical cavity as perceived by light present in the optical cavity of a BA-QCL. This may also or instead include selecting a number of excavations to include in the optical cavity of the BA-QCL.

As shown in block 904, the method 900 may include forming a perturbation in an optical cavity of a BA-QCL, where the perturbation extends from one or more walls of the optical cavity. As discussed herein, the perturbation may include a plurality of excavations. Thus, block 904 may include forming at least two excavations in a top surface (or another surface) of an optical cavity of a BA-QCL. The optical cavity may include an active region disposed between a top cladding and a bottom cladding, where the excavations extend into at least the top cladding of the optical cavity. Stated otherwise, block 904 may include forming at least two excavations in the top surface of the optical cavity of a BA-QCL, where the excavations are structurally configured to select a fundamental transverse mode of light in the optical cavity by constricting a lateral refractive index profile of the optical cavity. Block 904 may also or instead include providing other forms of perturbations in the optical cavity.

As shown in block 906, the method 900 may include extending one or more of the excavations into the active region of the optical cavity. This may also or instead include extending one or more of the excavations into the bottom cladding of the optical cavity.

The method 900 may also include, e.g., as part of the processes of block 904 or block 906 described above, selecting at least one or a size and a shape of a perturbation to modify a lateral refractive index profile of the optical cavity. For example, where the perturbation includes one or more excavations, each of the excavations may include a shape and a size selected such that the excavations collectively modify a lateral refractive index profile of the optical cavity.

As shown in block 908, the method 900 may include altering a lateral refractive index profile of the optical cavity, e.g., constricting the lateral refractive index profile of the optical cavity. The lateral refractive index profile of the optical cavity may be altered by the formation and presence of the perturbation (e.g., one or more excavations).

As shown in block 910, the method 900 providing a loss to high order transverse optical modes in the optical cavity using a perturbation. Thus, where the perturbation includes one or more excavations, the method 300 may include providing a loss to high order transverse modes of light in the optical cavity using the excavations. In other words, the excavations may provide additional loss to spatially filter the high order transverse modes of light in the optical cavity. Stated otherwise, any perturbation formed in the optical cavity may suppress high order transverse optical modes during operation of the broad area quantum cascade laser, whereby a fundamental transverse optical mode is selected over the high order transverse optical modes.

As shown in block 912, the method 900 may include selecting a fundamental transverse mode of light in the optical cavity using the perturbation (e.g., the one or more excavations).

The light emitted from the optical cavity may include one or more laser beams. For example, as shown in block 914, the method 900 may include providing a primarily single-lobed laser beam emitting from the optical cavity. The single-lobed laser beam may be formed at least in part by the excavations. That is, in certain implementations, without the excavations, the single-lobed laser beam would not be emitted from the optical cavity, e.g., multiple laser beams would instead be emitted from the optical cavity. Stated otherwise, the method 900 may include emitting a laser beam having a single lobe aligned with an optical axis of the optical cavity, where the plurality of excavations are structurally configured to collectively select the fundamental transverse optical mode over the high order transverse optical modes to provide the laser beam having the single lobe.

As shown in block 916, the method 900 may include providing a predetermined brightness of light emitted from the optical cavity. This may also or instead include providing one or more other predetermined properties of light emitted from the optical cavity including without limitation power, intensity, luminosity, flux, wavelength, frequency, and so on.

Thus, devices, systems, and methods disclosed herein may include the implementation of a relatively small, localized change in the lateral index profile of an optical cavity that is able to extract fundamental transverse mode operation in a BA-QCL device, which results in enhanced brightness and advantageous operability of the laser beam. In other words, a BA-QCL may be modified by placing a local perturbation in the lateral refractive index profile in a manner that selectively favors lasing in the transverse fundamental mode, when it would not otherwise be favored. The devices, systems, and methods disclosed herein may be translatable to all commonly practiced semiconductor fabrication methods, and may result in the scaling of brightness in BA-QCLs.

As stated above, although some of the accompanying figures show rectangular excavations (e.g., formed by focused ion beam milling), even when excavations are formed in a different manner, or have different geometries, or are filled with different materials, the techniques may continue to provide transverse mode selectivity sufficient to extract the fundamental mode and enhance a laser device.

A disclosed apparatus may include a BA-QCL that is capable of emitting a single lobed beam along the optical axis as a result of fundamental transverse mode operation that is made possible by the placement of a local perturbation in the lateral refractive index profile. For example, the local lateral refractive index profile may be achieved by etching excavations or trenches in the BA-QCL device. The local refractive index profile may also or instead be achieved by alternative methods, such as ion implantation, or selective current injection. Plasma etching methods that provide a local lateral refractive index may be formed by alternative means, including, but not limited to, focused ion beam milling. The local index profile may be achieved using excavations and/or other features with different shapes and geometries. The excavations formed (to provide the lateral index profile) may be filled-in with other materials, such as metals or oxides, or they may be completely devoid of material. A local index restriction may be used to select the fundamental mode in any type of laser cavity where the fundamental mode operation is not otherwise favored.

Unlike prior art techniques of using ion milled lateral constriction in a waveguide having a narrow cavity, in this disclosure, lateral constrictions in the waveguide are used in BA-QCLs with a much larger cavity width (w≈90 µm), with an eye toward promoting the fundamental mode in these devices so that the brightness can be substantially increased.

It will be appreciated that, although the devices, systems, and methods described above generally reference use in a BA-QCL, other broad area semiconductor diode lasers that are not QCLs may also or instead utilize the devices, systems, and methods described herein. In other words, the devices, systems, and methods described herein may be used in other broad area semiconductor diode lasers where high-order transverse modes preclude the emission of a single lobed beam originating from the fundamental mode.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So, for example performing the step of X includes any suitable method for causing another party such as a remote user, a remote processing resource (e.g., a server or cloud computer) or a machine to perform the step of X. Similarly, performing steps X, Y, and Z may include any method of directing or controlling any combination of such other individuals or resources to perform steps X, Y, and Z to obtain the benefit of such steps. Thus, method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A broad area quantum cascade laser, comprising:
   an optical cavity comprising an active region disposed between a top cladding and a bottom cladding;
   at least two excavations being formed in a top surface of the optical cavity, the at least two excavations protruding into the top cladding of the optical cavity, and beyond the top cladding and into the bottom cladding, the at least two excavations locally reducing a refractive index of the optical cavity;
   one or more of the at least two excavations having a cross section comprised of a polygon, a rectangle, a circle, an ellipse or an oblong shape, and
   a portion of the optical cavity disposed at least partially between the at least two excavations, where, during operation of the broad area quantum cascade laser, the at least two excavations favor a fundamental transverse mode of light within the portion by suppressing high order transverse optical modes of light.

2. The broad area quantum cascade laser of claim 1, wherein the fundamental transverse mode of light in the optical cavity would not be favored in the absence of the at least two excavations.

3. The broad area quantum cascade laser of claim 1, wherein the portion of the optical cavity in which the fundamental transverse mode of light is favored comprises an entire width and length of the optical cavity.

4. The broad area quantum cascade laser of claim 1, wherein the optical cavity is fabricated from a structure grown by gas source molecular beam epitaxy on an n–InP(001) substrate.

5. The broad area quantum cascade laser of claim 1, wherein each of the at least two excavations define a void that lacks material therein.

6. The broad area quantum cascade laser of claim 1, wherein the locally reduced refractive index of the optical cavity established by the at least two excavations is a function of a geometry of the at least two excavations.

7. The broad area quantum cascade laser of claim 1, wherein the top surface comprises the top cladding.

8. The broad area quantum cascade laser of claim 1, wherein the at least two excavations are structurally configured to one or more of provide loss to the high order transverse modes of light and cause the broad area quantum cascade laser to emit a single-lobed laser beam.

9. The broad area quantum cascade laser of claim 1, wherein at least one of a size, a shape, and a depth of each of the at least two excavations is selected to alter a lateral refractive index profile of the optical cavity to affect mode selection that is specific to light generated by the broad area quantum cascade laser.

10. The broad area quantum cascade laser of claim 1, wherein a size and a shape of each of the at least two excavations are identical.

11. The broad area quantum cascade laser of claim 1, wherein the at least two excavations are substantially aligned along an axis substantially perpendicular to an optical axis of the optical cavity.

12. A broad area quantum cascade laser, comprising:
an optical cavity comprising an active region disposed between a top cladding and a bottom cladding;
at least two excavations being formed in a top surface of the optical cavity and protruding into at least the top cladding, the at least two excavations locally reducing a refractive index of the optical cavity;
the optical cavity approximating a box having a geometry defined by a height of the optical cavity, a width of the optical cavity defined by sidewalls of the optical cavity, and a length of the optical cavity;
the sidewalls being etched to a depth below that of the active region; and
a portion of the optical cavity being disposed at least partially between the at least two excavations, where, during operation of the broad area quantum laser, the at least two excavations favor a fundamental transverse mode of light within the portion by suppressing high order transverse optical modes of light.

13. A method, comprising:
forming at least two excavations in a top surface of an optical cavity of a broad area quantum cascade laser, the optical cavity comprising an active region disposed between a top cladding and a bottom cladding, the at least two excavations extending into the top cladding of the optical cavity, and beyond the top cladding and into the bottom cladding;
one or more of the at least two excavations having a cross section comprised of a polygon, a rectangle, a circle, an ellipse or an oblong shape;
locally reducing a refractive index of the optical cavity with the at least two excavations;
suppressing high order transverse optical modes of light within the optical cavity with the at least two excavations; and
favoring a fundamental transverse mode of light within a portion of the optical cavity disposed at least partially between the at least two excavations.

14. The method of claim 13, further comprising providing a loss to high order transverse modes of light in the optical cavity using the at least two excavations.

15. The method of claim 13, wherein each of the at least two excavations define a void that lacks material therein.

16. The method of claim 13, further comprising selecting a geometry of the at least two excavations to provide a predetermined locally reduced refractive index of the optical cavity.

* * * * *